United States Patent
Tan et al.

(10) Patent No.: US 7,888,935 B1
(45) Date of Patent: Feb. 15, 2011

(54) K-SPACE TRAJECTORY ESTIMATION IN SPIRAL MRI SYSTEM AND RELATED METHOD THEREOF

(75) Inventors: Hao Tan, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 332 days.

(21) Appl. No.: 12/036,654

(22) Filed: Feb. 25, 2008

Related U.S. Application Data

(60) Provisional application No. 60/903,143, filed on Feb. 23, 2007.

(51) Int. Cl.
*G01V 3/00* (2006.01)
(52) U.S. Cl. ........................ 324/309; 324/307
(58) Field of Classification Search ............... 324/309, 324/307
See application file for complete search history.

(56) References Cited

U.S. PATENT DOCUMENTS

| | | | |
|---|---|---|---|
| 4,885,542 A * | 12/1989 | Yao et al. .................. | 324/313 |
| 5,483,567 A | 1/1996 | Swerdloff | |
| 5,485,086 A | 1/1996 | Meyer et al. | |
| 5,910,728 A | 6/1999 | Sodickson | |
| 6,020,739 A | 2/2000 | Meyer et al. | |
| 6,064,388 A | 5/2000 | Reyzin | |
| 6,178,271 B1 | 1/2001 | Maas, III | |
| 6,239,598 B1 * | 5/2001 | Zhang .................... | 324/309 |
| 6,288,545 B1 * | 9/2001 | King et al. .............. | 324/318 |
| 6,326,786 B1 | 12/2001 | Pruessmann et al. | |
| 6,741,672 B2 * | 5/2004 | Gaddipati et al. ............. | 378/4 |
| 6,841,998 B1 | 1/2005 | Griswold et al. | |
| 6,853,191 B1 | 2/2005 | Miller et al. | |
| 6,903,551 B2 | 6/2005 | Madore | |
| 7,132,827 B2 | 11/2006 | Griswold et al. | |
| 7,202,663 B2 | 4/2007 | Huang | |
| 7,348,776 B1 | 3/2008 | Aksoy et al. | |

OTHER PUBLICATIONS

Griswold, Mark A., et al., "Generalized Autocalibrating Partially Parallel Acquisitions (GRAPPA)" Magnetic Resonance in Medicine 47:1202-1210 (2002).

Pruessmann, Klaas P. et al., "Advance in Sensitivity Encoding With Arbitrary k-Space Trajectories", Magnetic Resonance in Medicine 46:638-651 (2001).

Griswold, M.A. et al., "The GRAPPA Operator" Proc. Intl. Soc. Reson. Med 11:2348 (2003).

Heberlein, K.A. et al., "Segmented Spiral Parallel Imaging Using GRAPPA" Proc. Intl. Soc. Mag. Reson. Med. 11:328 (2004).

(Continued)

*Primary Examiner*—Louis M Arana
(74) *Attorney, Agent, or Firm*—Blank Rome LLP

(57) ABSTRACT

First, benchmark data are collected on two thin slices of an object to get measured k-space trajectories. To find delays on different physical gradients, the root mean square error between estimated and measured k-space trajectories is minimized for different delays. To reduce the error further, an eddy current compensation is introduced along each physical gradient axis. A more accurate estimation of the k-space trajectory can be obtained to image the object.

12 Claims, 4 Drawing Sheets

OTHER PUBLICATIONS

Nayak, Krishna S. et al., "Real Time Interactive Coronary MRA", Magnetic Resonance in Medicine 46:430-435 (2001).

Yeh, Ernest N. et al., "3 Parallel Magnetic Resonance Imaging with Adaptive Radius in k-Space (PARS): Constrained Image Reconstruction using k-Space Locality in Radiofrequency Coil Encoded Data" Magnetic Resonance in Medicine 53:1383-1392 (2005).

Sodickson, Daniel K. et al., "Simultaneous Acquisition of Spatial Harmonics (SMASH): Fast Imaging with Radiofrequency Coil Arrays" Magnetic Resonance in Medicine 38:591-603 (1997).

Pruessmann, Klaas P. et al., "SENSE: Sensitivity Encoding for Fast MRI" Magnetic Resonance in Medicine 42:952-962 (1999).

Heidemann, R.M. et al., "Fast Parallel Image Reconstructions With non- Cartesian Trajectories", Proc. Intl. Soc. Mag. Reson. Med. 11:2374 (2003).

Bernstein, Matt A. et al, Handbook of MRI Pulse Sequence, Elsevier Academic Press, 204, pp. 319-323.

Speier, P. et al., "Robust Radial Imaging with Predetermined Isotropic Gradient Delay Correction," Proc. Intl. Soc. Mag. Reson. Med. 14 (2006), p. 2379.

DeZanche, N. et al., "Advances in NMR Probe Technology for Magnetic Field Monitoring," Proc. Intl. Soc. Mag. Reson. Med. 14 (2006) p. 781.

Jung, Youngkyoo, et al., Consistent Non-Cartesian Off-Axis MRI Quality: Calibrating and Removing Multiple Sources of Demodulation Phase Errors, Magnetic Resonance in Medicine 57:206-212 (2007).

Aldefeld, B. et al., "Effects of Gradient Anisotropy in MRI," Magnetic Resonance in Medicine, 39:606-614 (1998).

Davies, Nigel P., et al., "Calibration of Gradient Propagation Delays for Accurate Two-Dimensional Radiofrequency Pulses," Magnetic Resonance in Medicine 53:231-236 (2005).

Duyn, Jeff H., et al., "Simple Correction Method for K-space Trajectory Deviations in MRI," J Magn Reson 1998, 132:150-153.

Peters, Dana C., et al., "Centering the Projection Reconstruction Trajectory: Reducing Gradient Delay Errors," Magn Reson Med 2003, 50:1-6.

Zhang, Yantian, et al., "A Novel K-space Trajectory Measurement Technique," Magn Reson Med 1998, 39:999-1004.

Spielman, Daniel, et al., "Spiral Imaging on a Small-Bore System at 4.7T," Magn Reson Med 1995, 34:580-585.

Hu, P. et al, "BOSCO: Parallel Image Reconstruction Based on Successive Convolution Operations," in Proceedings of the 15th Annual Meeting ISMRM, Seattle, 2006, p. 10.

Barmet, C. et al., "Efficient Iterative Reconstruction for MRI in Strongly Inhomogeneous B0," Proceedings of the 13th Annual Meeting of ISMRM, Miami, 2004, p. 347.

Barmet, C. et al., "Sensitivity encoding and B0 Inhomogeneiy—A simultaneous Reconstruction," proceedings of the 14th Annual Meeting of ISMRM, Seattle, 2005, p. 682.

Heberlein, K. A., et al., "Segmented Spiral Parallel Imaging Using GRAPPA," Proc. Intl. Soc. Mag. Reson. Med 11 (2004) p. 328.

Gurney et al. [P. Gurney, J. Pauly, D.G. Nishimura, "a simple method for measuring B0 eddy currents", Proc. ISMRM, 13: 866 (2005)].

* cited by examiner

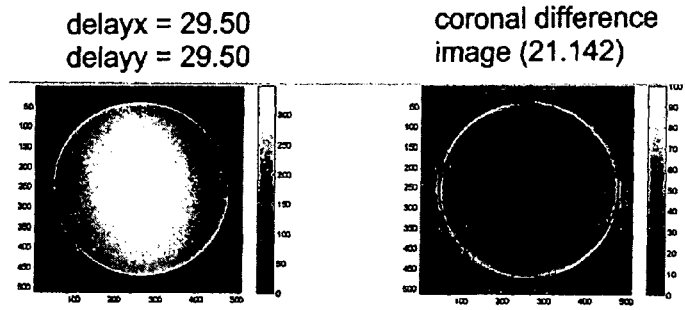
FIG. 1A  FIG. 1B
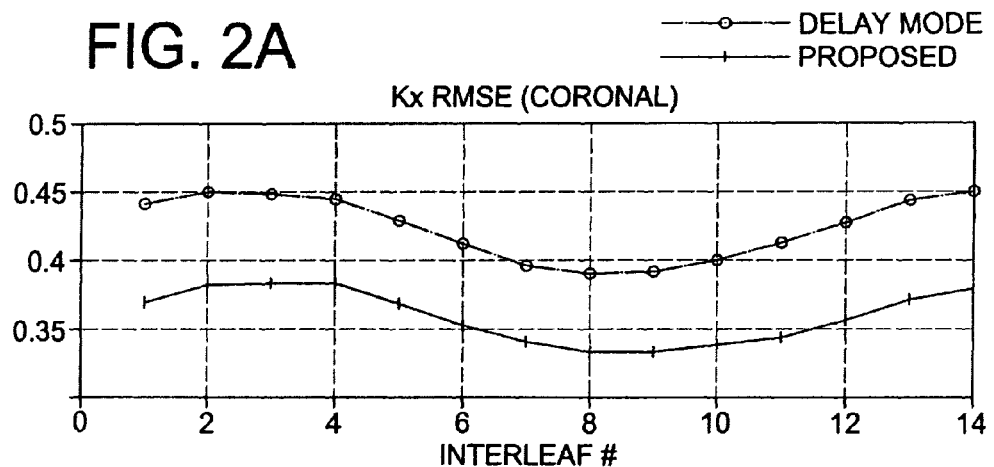
FIG. 2A
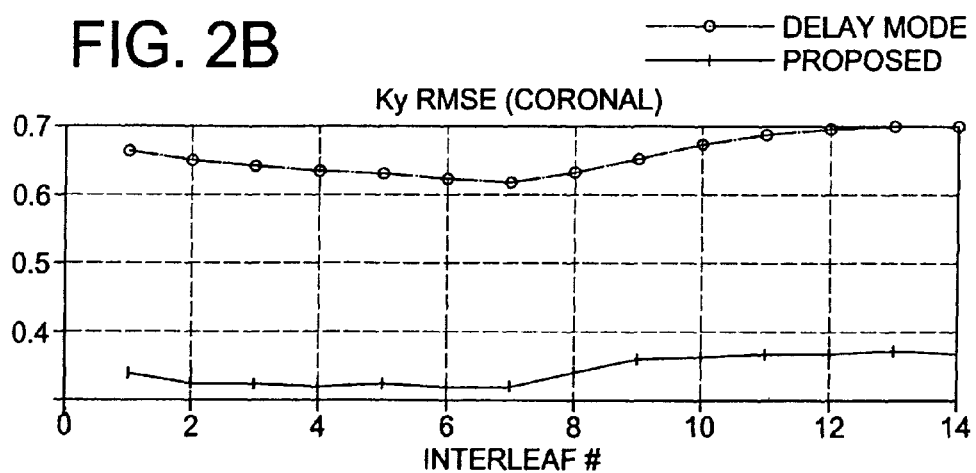
FIG. 2B

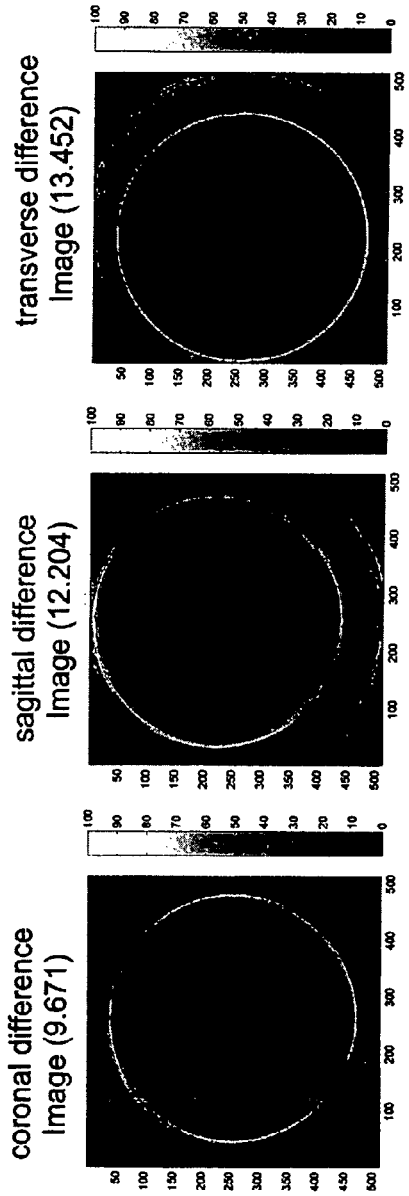
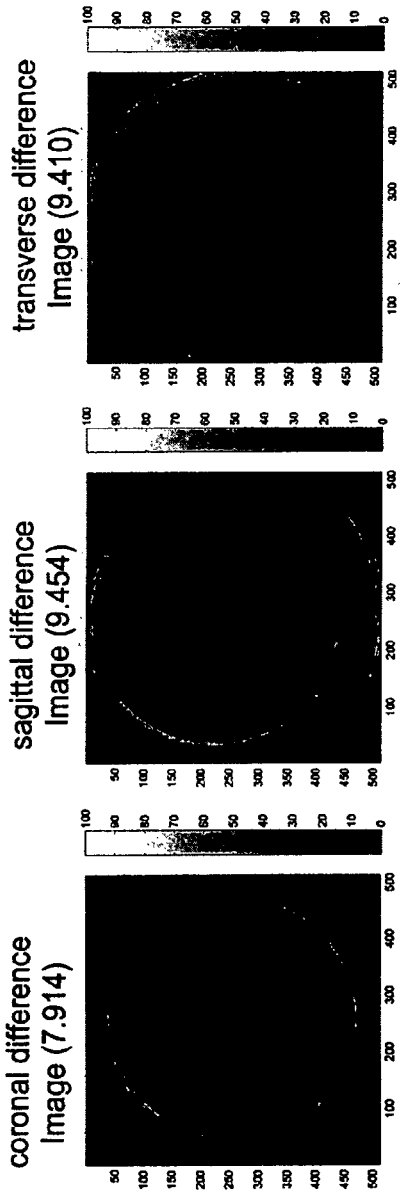

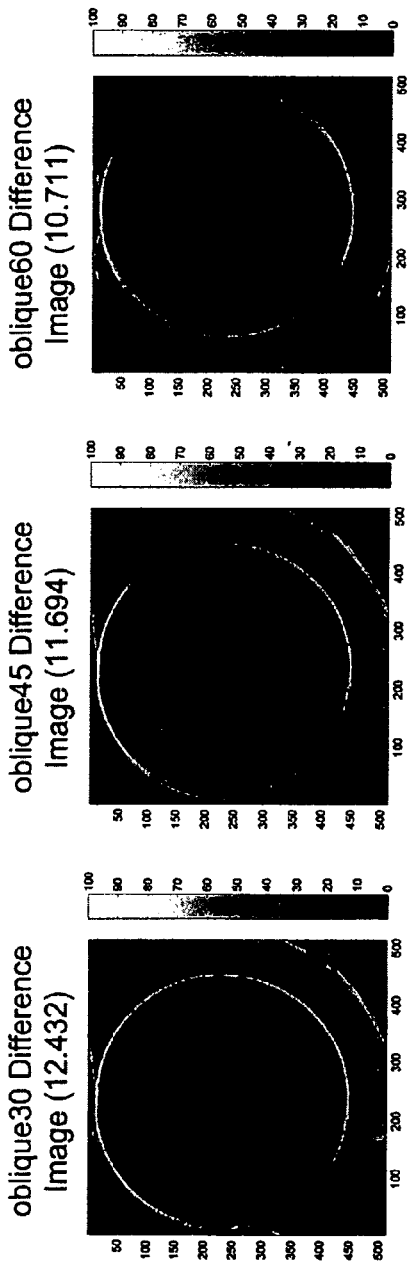
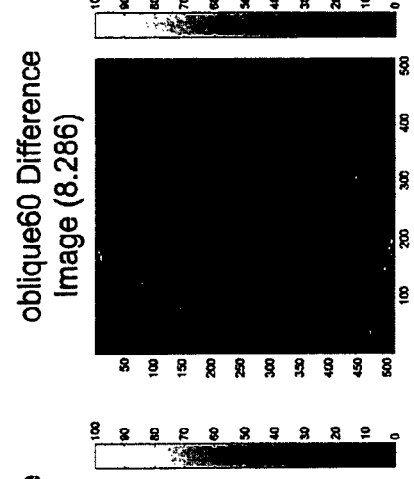
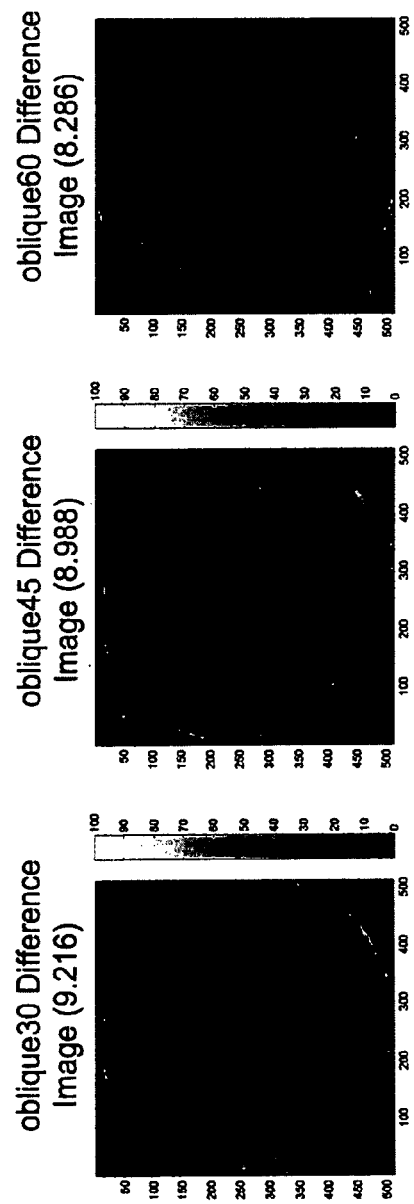
FIG. 4A  FIG. 4B  FIG. 4C  FIG. 4D  FIG. 4E  FIG. 4F

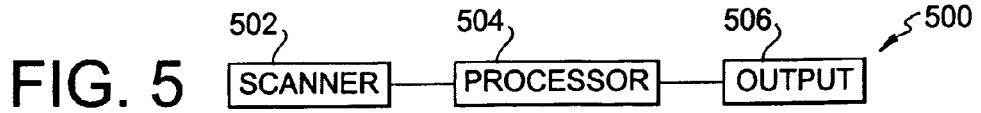
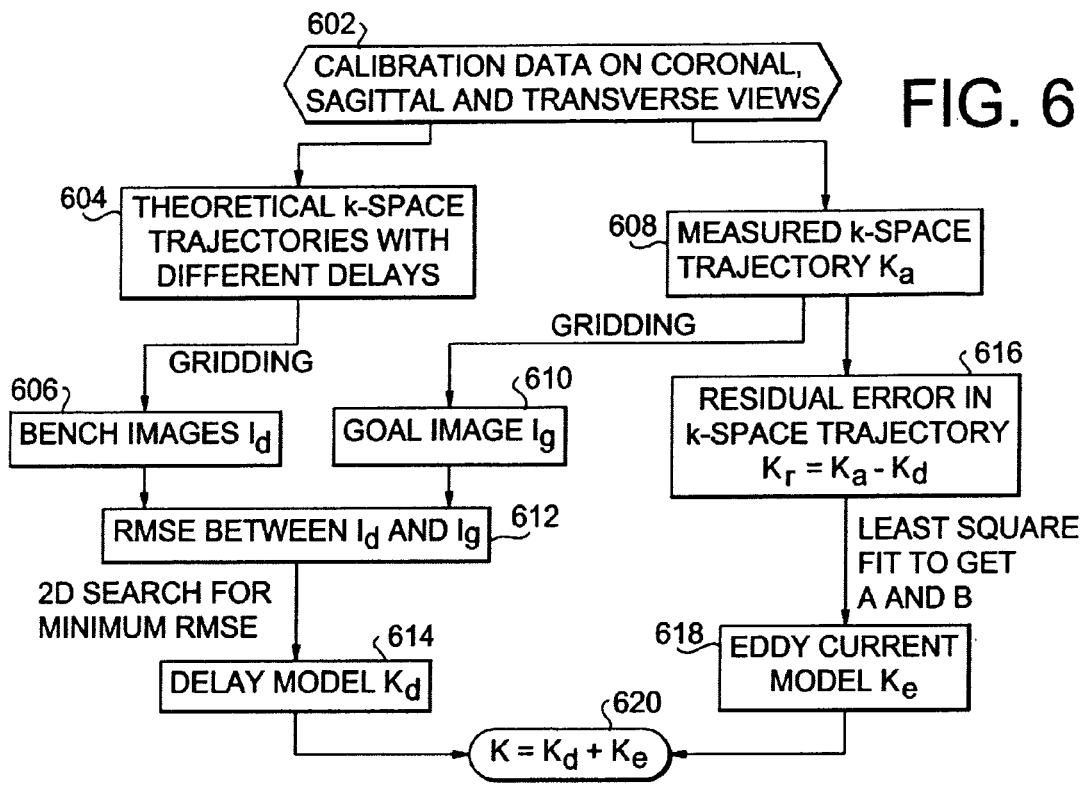
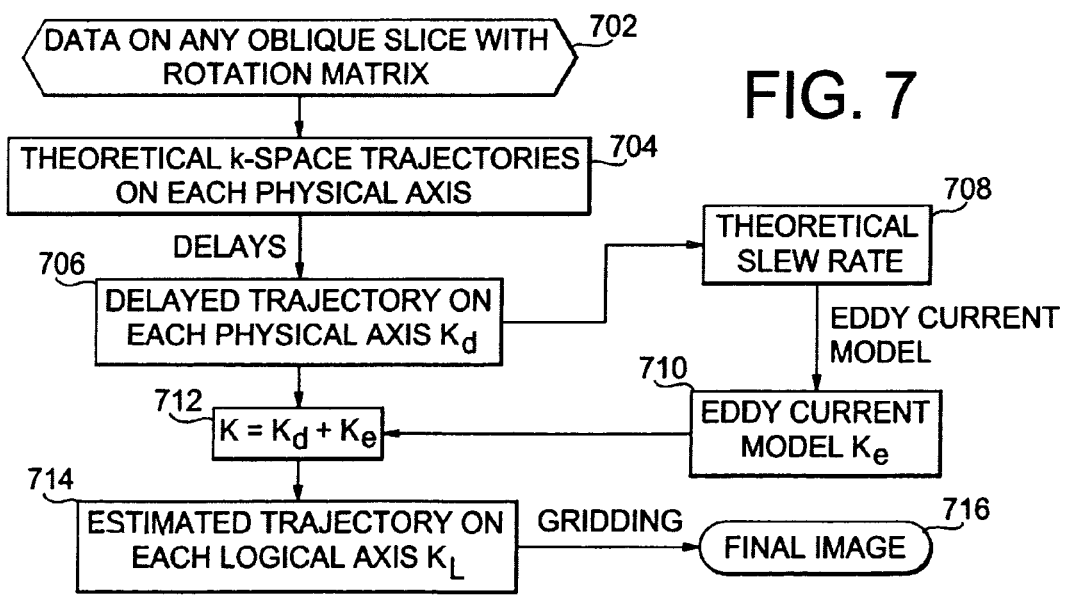

K-SPACE TRAJECTORY ESTIMATION IN SPIRAL MRI SYSTEM AND RELATED METHOD THEREOF

REFERENCE TO RELATED APPLICATION

The present application claims the benefit of U.S. Provisional Patent Application No. 60/903,143, filed Feb. 23, 2007, whose disclosure is hereby incorporated by reference in its entirety into the present disclosure.

STATEMENT OF GOVERNMENT INTEREST

The work leading to the present invention was supported by NIH Grant No. R01 HL079110. The government has certain rights in the invention.

FIELD OF THE INVENTION

The present invention is directed to magnetic resonance (MR) imaging and more specifically to k-space trajectory estimation using an anisotropic gradient delay model.

DESCRIPTION OF RELATED ART

For non-2DFT data acquisition in MRI, k-space trajectory infidelity due to eddy current effects and other hardware imperfections will blur and distort the reconstructed images. Even with the shielded gradients and eddy current compensation techniques of current scanners, the deviation between the actual k-space trajectory and the requested trajectory remains a major reason for image artifacts in non-Cartesian MRI. Techniques have been proposed to measure the k-space trajectory in order to correct for gradient imperfections. However, it is usually not practical to measure the k-space trajectory for each imaging slice.

In MR data acquisition, eddy currents introduced by gradient coils produce an additional field that tends to prevent the gradient field from changing. To reduce the eddy current effect, manufacturers have active shielding and pre-emphasis filters in current scanners to eliminate most of the errors. However, the residual error can still cause severe image artifacts, especially in non-Cartesian scanning such as radial and spiral imaging. Eddy currents are typically classified as $B_0$ eddy currents or linear eddy currents based on their spatial dependence. $B_0$ eddy currents cause unwanted phase modulation, while linear eddy currents distort the k-space trajectory. There are many ways to measure the linear term, including using the phase difference of two measurements, measuring the current through the gradient coil directly, and using a special phantom to measure the k-space trajectory. Aside from uncompensated eddy current effects leading to distortions of the gradient waveform shape, another significant problem is small timing delay errors arising in the hardware. These anisotropic timing delays exist between the application of a gradient waveform to the gradient amplifiers and the subsequent response of the gradient coils. There are also frequency demodulation delays.

SUMMARY OF THE INVENTION

Here we introduce a simple and effective model to estimate the k-space trajectory in spiral image reconstruction with the measured k-space trajectory as the goal. The root mean square error (RMSE) and peak error in phantom images reconstructed using the proposed method are reduced substantially compared to the results achieved by only tuning delays.

In order to get better-quality reconstructions in spiral MRI, we introduce a k-space trajectory estimation method based on an anisotropic gradient delay model with additional eddy current compensation. The phantom images reconstructed using this method in two datasets collected 48 days apart have a much smaller RMSE and peak error compared with the results using delay only model.

BRIEF DESCRIPTION OF THE DRAWINGS

A preferred embodiment of the invention will be set forth with reference to the drawings, in which:

FIGS. 1A and 1B show coronal view results using the same delay on all axes;

FIGS. 2A and 2B show the RMSE in the k-space trajectory for the delay model and the preferred embodiment;

FIGS. 3A-3F show difference images between the benchmark and the reconstruction for the delay model (FIGS. 3A-3C) and the preferred embodiment (FIGS. 3D-3F);

FIGS. 4A-4F show difference images between the benchmark and the reconstruction for the delay model (FIGS. 4A-4C) and the preferred embodiment (FIGS. 4D-4F) for oblique slices;

FIG. 5 is a schematic diagram showing hardware on which the present invention can be implemented;

FIG. 6 is a flow chart of model estimation using calibration data from coronal, sagittal and transverse views; and FIG. 7 is a flow chart of k-space trajectory estimation for an arbitrary imaging slice using the proposed model.

DETAILED DESCRIPTION OF THE PREFERRED EMBODIMENT

A preferred embodiment of the present invention will now be set forth in detail with reference to the drawings.

First, we collect data on two thin slices offset symmetrically around isocenter for coronal, sagittal and transverse views. The $B_0$ eddy currents are then measured using the method proposed by Gurney et al. [P. Gurney, J. Pauly, D. G. Nishimura, "a simple method for measuring B0 eddy currents", Proc. ISMRM, 13: 866 (2005)] and deducted from the corresponding phase term. Dividing the corrected signal phase by the slice distance, we get the measured k-space trajectories $K_b$ in each view for calibration purposes. Dividing the corrected signal phase by the slice distance, we get the actual k-space trajectories $K_b$ on each physical gradient axis in each view as follows for calibration purposes:

$$K_b = [(P_+)(g_+) - P_+(g_-)) - (P_-(g_+) - P_-(g_-))]/(4D)$$

where $P_\pm()$ are the phase terms in two symmetrical slices; $g_\pm$ are the gradient waveform to be tested and its inverted version; D is the distance between the offset slice and isocenter. Using these measured k-space trajectories, we perform gridding reconstruction to get the benchmark images. A second dataset on some oblique slices was collected after 48 days in order to test the proposed method.

To find the delays on different physical gradients, we conduct a 2D search for the minimum RMSE between the images reconstructed using different delays and the benchmark for each view. With the optimum delays on each physical gradient axis, we have the first guess of the k-space trajectory $K_d$. For an arbitrary imaging slice, we can compensate the isotropic delay with the knowledge of the rotation matrix (similar to the equations in Peters D C, Derbyshire J A, McVeigh E R. "Centering the projection reconstruction trajectory: reducing gradient delay errors." Magn Reson Med, 50: 1-6. (2003)) as the following.

$$G_d = R^T T(G_{phy}) \tag{1}$$

where $G_d$ is the final logical gradients for image reconstruction program to calculate the k-space trajectory. R is the rotation matrix transforms a logical gradients vector into a physical gradient vector. T is the delay operator that applies different delays on each physical gradient axis. $G_{phy}=[g_x \ g_y \ g_z]$ is the physical gradient vector associated with the requested logical gradient vector $G_{log}=[g_{ro} \ g_{ph} \ g_s]$, i.e. $G_{phy}=RG_{log}$. With the delayed logical gradient vector $G_d$, we can integrate it on each axis to get the k-space trajectory $K_d$.

However, the k-space trajectory difference $\Delta K = K_b - K_d$ is still large and the images using this delay model have significant residual error. In order to reduce the deviation between the modeled k-space trajectory and the actual measured k-space trajectory, we introduce an additional eddy current compensation term on each physical gradient axis. In a simple eddy current model, the eddy current g(t) can be estimated by the convolution of the slew rate s(t)=−dG/dt of the desired gradient waveform and the system impulse response function H(t) as the following.

$$H(t) = u(t) \sum_n a_n \exp(-t/b_n) \tag{2}$$

where u(t) is the unit step function. Therefore, we can treat the difference between the measured k-space trajectory and the k-space trajectory from the delay model as the residual eddy current to be accounted for using the simple model. For each exponential term $e(t)=a_n u(t) \exp(-t/b_n)$ in H(t), if we only consider the first order Taylor expansion, i.e. $e(t) \approx a_n u(t)(1-t/b_n)$, the convolution can be simplified to the following expression.

$$s(t) \otimes e(t) = -dG/dt \otimes a_n u(t) \exp(-t/b_n) \tag{3}$$
$$\approx -dG/dt \otimes a_n u(t)(1-t/b_n)$$
$$= a_n \left[ -\int_0^t (dG/d\tau) d\tau + \int_0^t (dG/d\tau)t - \tau) / b_n d\tau \right]$$
$$= a_n \left[ -G(t) + G(t)t/b_n - \int_0^t (dG/d\tau)\tau d\tau / b_n \right]$$

The resulting k-space trajectory is the integration of the above convolution result as in (4).

$$k_e(t) = \int s(t') \otimes e(t') dt' \tag{4}$$
$$\approx a_n \int \left[ -G(t') + G(t')t'/b_n - \int_0^{t'} (dG/d\tau)\tau d\tau / b_n \right] dt'$$

Using the discretized version of the above equation, we can get a 3 by N vector $K_e = \text{cumsum}(G_e)$ for each physical gradient, where $G_e = [G(t_n); G(t_n)t_n; \Sigma_1^n s(t_m)t_m]^T$ and N is the number of k-space samples in one spiral interleaf, cumsum( ) is a Matlab function (The MathWorks) that calculates the cumulative sum of array elements. Then we can get a vector $a = [a_n \ 1/b_n \ c/b_n]$ by using weighted least squares (WLS) to fit the k-space difference $\Delta K$ to $K_e$ on each physical gradient axis, where c is a constant related to the sampling time. In fact, you can also fit the derivative of $\Delta K$ to $G_e$ if you are more interested in the actual gradients. It is also interesting to note that we have many choices here to use the fitting result for future calibration. The first choice would be to use an impulse function H(t) with only one exponential term, ignoring any additional exponential terms. The second choice would be to combine the last two parameters together, since they are only different by a constant scale. The last option is to use is the full correction to give the system more freedom. Though the last two methods should lead to the same result theoretically, it turned out they do not because of noise. So we chose the last one here for simplicity though we might return to the first one with a different fitting target function in the future. Thus no matter how many exponential terms are in H(t), we should be able to get rid of the first order eddy current effect by applying these parameters on each physical axis. For an arbitrary scan slice, the logical k-space trajectory vector for image reconstruction can be derived as the following.

$$K_{new} = K_d + AK_a \tag{5}$$

where A is a 3 by 9 matrix with the following nonzero elements from the WLS results.

$$A(1, 1:3) = a_x \tag{6}$$
$$A(2, 4:6) = a_y$$
$$A(3, 7:9) = a_z$$

$K_a$ is a 9 by N matrix with $K_e$ on all three physical axes.

$$K_a = \begin{bmatrix} K_{ex} \\ K_{ey} \\ K_{ez} \end{bmatrix} \tag{7}$$

The above will be summarized with reference to the flow charts of FIG. 6, for model estimation using calibration data from coronal, sagittal and transverse views, and FIG. 7, for k-space trajectory estimation for an arbitrary imaging slice using the proposed model. The calibration of FIG. 6 and the imaging of FIG. 7 can be done on the same object or on different objects. Usually, one can calibrate once for a given scanner, and the object in the scanner at the time of the calibration is a phantom (e.g., a bottle of water). A person could be used as well. Then the model is calculated, and the parameters are stored. The model is then applied each time the scanner is used for imaging subsequently.

In FIG. 6, step 602, calibration data are taken on coronal, sagittal, and transverse views. In step 604, theoretical k-space trajectories with different delays are determined and then gridded to produce bench images $I_d$ in step 606. In parallel, in step 608, an actual k-space trajectory $K_a$ is measured and then gridded to produce a goal image $I_g$. In step 612, the RMSE between the bench and goal images is determined. Through a 2D search for a minimum RMSE, the delay model $K_d$ is determined. In step 616, a residual error in the k-space trajectory is calculated as a difference between the measured trajectory and the delay model. A least-square fit is used to derive the eddy current model in step 618, and the delay model and the eddy current model are summed in step 620 to yield the estimated k-space trajectory.

In FIG. 7, step 702, data are taken on any oblique slice with a rotation matrix. In step 704, the theoretical k-space trajectories are determined on each physical axis. The delays are applied to yield the delayed trajectory on each physical axis $K_d$ in step 706. In step 708, the theoretical slew rate is determined, and in step 710, the eddy current model is derived in step 710. In step 712, the delayed trajectory and the eddy current model are added to provide the estimated k-space trajectory. In step 714, the estimated trajectory on each logical axis is determined. In step 716, the final image is determined.

We applied our algorithm and related method and system to two data sets acquired using a gradient-echo spiral scan with field map correction. The first dataset is used for calibration which was acquired more than one month before the second dataset on the same Siemens Avanto 1.5 T scanner (Siemens Medical Solutions). The readout for each slice was done with 16 interleaved spirals each of 16.38 ms readout duration. The samples within the first two interleaves of the readouts were used to estimate the field map. The reconstructed image matrix was 512 by 512. The distance between the slice to the isocenter in the first dataset is 50 mm and the field of view (FOV) is 280 mm with slice thickness 0.9 mm. The delays and additional gradient compensation parameters were estimated on the first dataset and applied to the second dataset.

In FIGS. 1A and 1B, we show the reconstruction results using the same delay (29.5 μs) on all axes. These figures show the coronal view results using a single delay on both axes (RMSE=21.142) for a phantom image and a difference image, respectively. The residual error is surprisingly high and has to be corrected. So we perform a 2D search for the minimum RMSE on each slice; the results are in Table 1 below. The delays on the same physical gradient from different slices are exactly the same by this method except the physical Y gradient.

In FIGS. 2A and 2B, we show the RMSE in the k-space trajectory for kx and ky, respectively, by using the proposed method and the delay only model in the coronal view. The RMSE is reduced to less than 85% on X axis and 55% on Y axis.

In FIGS. 3A-3F, the difference between the benchmark and images reconstructed using both models are shown in three different views from the calibration data set. FIGS. 3A-3C are for the delay model for an RMSE of 9.671, 12.204, and 13.452, respectively. FIGS. 3D-3F are for the preferred embodiment for an RMSE of 7.914, 9.454, and 9.410, respectively.

In FIGS. 4A-4F, difference images on three oblique slices from the second dataset are shown. These figures are difference images between benchmark and reconstruction using the delay model (FIGS. 3A-3C) and the preferred embodiment (FIGS. 3D-3F) on three oblique slices oriented 30 (FIGS. 3A and 3D), 45 (FIGS. 3B and 3E) and 60 (FIGS. 3C and 3F) degrees between transverse and sagittal orientations. The RMSE for FIGS. 3A-3F is 12.432, 11.694, 10.711, 9.216, 8.988, and 8.286, respectively. It is very clear the preferred embodiment yields a more accurate reconstruction with smaller RMSE and peak error compared with the delay only model.

TABLE 1

2D search results for different delays

| Vie | Axis | |
| --- | --- | --- |
|  | Logical X | Logical Y |
| Coronal | 31.5 (physical z) | 28.5 (physical x) |
| Sagittal | 31.5 (physical z) | 30.0 (physical y) |
| Transverse | 28.5 (physical x) | 29.5 (physical y) |

We measured significant gradient delay asymmetry causing severe image artifacts as in FIGS. 1A and 1B. In order to reduce the artifacts from the k-space trajectory infidelity, we proposed an estimation method which combines tuning the delays on different physical gradient axis and an additional eddy current compensation model. We tested the method on phantom image reconstruction using two data sets acquired with a spiral gradient echo sequence. From the difference images in FIGS. 3A-3F and FIGS. 4A-4F, we can see the residual errors around the phantom edges are much smaller using the preferred embodiment. The RMSE and peak difference have been reduced substantially as well. Furthermore, there is little time penalty for using this method after the one-time system calibration.

An example of hardware on which the present invention can be implemented is shown in FIG. 5. The hardware 500 includes a scanner 502, a processor 504, and an output 506 such as as a display.

While a preferred embodiment of the present invention has been set forth in detail above, those skilled in the art who have reviewed the present disclosure will readily appreciate that other embodiments can be realized within the scope of the invention. For example, numerical values are illustrative rather than limiting, as are examples of specific technologies and sources. Therefore, the present invention should be construed as limited only by the appended claims.

We claim:

1. A method for imaging an object, the method comprising:
   (a) scanning at least two slices of a calibration object;
   (b) measuring k-space trajectories in said at least two slices to obtain benchmark data;
   (c) scanning the object to obtain image data for a plurality of gradient axes;
   (d) applying an anisotropic delay to the image data for each of the gradient axes, wherein the anisotropic delay is determined so as to minimize an error between the image data and the benchmark data;
   (e) obtaining a first k-space trajectory estimate from the image data to which the anisotropic delay has been applied;
   (f) applying an eddy current compensation to the image data for each of the gradient axes, the eddy current compensation being determined in accordance with a difference between the measured k-space trajectories and the first k-space trajectory estimate;
   (g) obtaining a second k-space trajectory estimate from the image data with the anisotropic delay and the eddy current compensation applied; and
   (h) reconstructing an image of the object using the second k-space trajectory estimate.

2. The method of claim 1, wherein said at least two slices comprise two slices symmetrically offset around an isocenter of the calibration object for coronal, sagittal, and transverse views of the object.

3. The method of claim 2, wherein the measured k-space trajectories are obtained by measuring eddy currents and phase terms in said two symmetrically offset slices, deducting the measured eddy currents from the phase terms to obtain corrected phase terms, and dividing the corrected phase terms by a distance between the two symmetrically offset slices.

4. The method of claim 1, wherein the anisotropic delay is applied to a physical gradient vector, which is rotated to obtain a logical gradient vector.

5. The method of claim 1, wherein the eddy current compensation is determined from a convolution of a slew rate of a desired gradient waveform and a system impulse response function.

6. A system for imaging an object, the system comprising:
   a scanner for scanning the object;
   a processor, in communication with the scanner, for scanning at least two slices of a calibration object, measuring k-space trajectories in said at least two slices to obtain benchmark data, scanning the object to obtain image data for a plurality of gradient axes, applying an anisotropic delay to the image data for each of the gradient axes, wherein the anisotropic delay is determined so as to minimize an error between the image data and the benchmark data, obtaining a first k-space trajectory estimate from the image data to which the anisotropic delay has been applied, applying an eddy current compensation to the image data for each of the gradient axes, the eddy current compensation being determined in accordance with a difference between the measured k-space trajectories and the first k-space trajectory estimate, obtaining a second k-space trajectory estimate from the image data with the anisotropic delay and the eddy current compensation applied, and reconstructing an image of the object using the second k-space trajectory estimate; and an output, in communication with the processor, for outputting the image.

7. The system of claim 6, wherein said at least two slices comprise two slices symmetrically offset around an isocenter of the calibration object for coronal, sagittal, and transverse views of the object.

8. The system of claim 7, wherein the measured k-space trajectories are obtained by measuring eddy currents and phase terms in said two symmetrically offset slices, deducting the measured eddy currents from the phase terms to obtain corrected phase terms, and dividing the corrected phase terms by a distance between the two symmetrically offset slices.

9. The system of claim 6, wherein the anisotropic delay is applied to a physical gradient vector, which is rotated to obtain a logical gradient vector.

10. The system of claim 6, wherein the eddy current compensation is determined from a convolution of a slew rate of a desired gradient waveform and a system impulse response function.

11. A method for imaging an object with a scanner, the method comprising:
(a) retrieving benchmark data and calibration data for the scanner, the benchmark data and the calibration data representing k-space trajectories of a calibration object measured in the scanner;
(b) scanning the object to obtain image data for a plurality of gradient axes;
(c) applying an anisotropic delay to the image data for each of the gradient axes, wherein the anisotropic delay is determined so as to minimize an error between the image data and the benchmark data;
(d) obtaining a first k-space trajectory estimate from the image data to which the anisotropic delay has been applied;
(e) applying an eddy current compensation to the image data for each of the gradient axes, the eddy current compensation being determined in accordance with a difference between the measured k-space trajectories and the first k-space trajectory estimate;
(f) obtaining a second k-space trajectory estimate from the image data with the anisotropic delay and the eddy current compensation applied; and
(g) reconstructing an image of the object using the second k-space trajectory estimate.

12. The method of claim 11, wherein the benchmark data and the calibration data retrieved in step (a) are formed by:
(i) scanning at least two slices of the calibration object with the scanner;
(ii) measuring k-space trajectories in said at least two slices to obtain the benchmark data; and
(iii) calibrating the scanner in accordance with the k-space trajectories measured in step (ii).

\* \* \* \* \*